United States Patent
Kim et al.

(10) Patent No.: US 6,427,223 B1
(45) Date of Patent: *Jul. 30, 2002

(54) METHOD AND APPARATUS FOR ADAPTIVE VERIFICATION OF CIRCUIT DESIGNS

(75) Inventors: Won Sub Kim, Fremont; John Harold Downey, San Jose; Daniel Marcos Chapiro, Palo Alto, all of CA (US)

(73) Assignee: Synopsys, Inc., Mountain View, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/303,181

(22) Filed: Apr. 30, 1999

(51) Int. Cl.⁷ .............................................. G06F 17/50
(52) U.S. Cl. .................................. 716/4; 716/5; 716/6
(58) Field of Search ................................... 716/4, 5, 6

(56) References Cited

U.S. PATENT DOCUMENTS

| | | | |
|---|---|---|---|
| 4,070,565 A | * | 1/1978 | Borrelli ........................ 716/4 |
| 4,937,827 A | | 6/1990 | Beck et al. ................... 714/33 |
| 5,202,889 A | | 4/1993 | Aharon et al. ................. 716/3 |

(List continued on next page.)

OTHER PUBLICATIONS

U.S. patent application Ser. No. 60/048,755, Hollander et al., filed Jun. 03, 1997.

IBM TDB ("Behavioral Fault Simulation", IBM Technical Disclosure Bulletin, vol. 28, No. 4, Sep. 1, 1985, pp. 1577–1578 (1–3)).

(List continued on next page.)

*Primary Examiner*—Trong Phan
(74) *Attorney, Agent, or Firm*—Jonathan T. Kaplan; Howrey Simon Arnold & White, LLP

(57) ABSTRACT

The present invention adds capabilities to a Hardware Verification Language (HVL) which facilitate the monitoring of a device under test (DUT). The HVL language supports Object-Oriented Programming (or OOP). Within this OOP framework, the present invention provides a monitoring facility comprised of three main stages: i) Coverage Definitions, ii) Coverage Instantiation and Triggering and iii) Coverage Feedback. A coverage definition is very similar to an OOP class definition, but does not contain methods or variables. Instead, the basic purpose of a coverage definition is to declare "monitor bins" in terms of a state variable. Essentially, each monitor bin declaration has a unique bin name which is associated with a particular behavior of the state variable and the unique bin name is used to record the state variable's behavior. Instantiation of a coverage definition produces a coverage instance. Two key instantiation parameters are: an actual state variable that is to be monitored by the instance and a trigger expression which determines when the state variable of the instance is to be monitored. Instantiating means that a concurrent, non-terminating, "coverage instance process" is also forked off. The "foreground" thread of control which forked off the coverage instance process may continue to operate and subject a DUT to stimuli. The DUT's responses to such stimuli may be monitored by the coverage instance process and stored as data associated with the coverage instance. The same foreground thread of control subjecting the DUT to stimuli can also query the resulting state of the coverage instance's data. This ability to query a coverage instance's data make possible "closed loop" testing since the foreground thread of control can subsequently alter further stimuli generated for the DUT based upon the results of its query.

3 Claims, 6 Drawing Sheets

Microfiche Appendix Included
(5 Microfiche, 442 Pages)

U.S. PATENT DOCUMENTS

| | | | |
|---|---|---|---|
| 5,469,367 A | 11/1995 | Puri et al. ...................... 716/18 |
| 5,513,122 A | 4/1996 | Cheng et al. ................... 716/5 |
| 5,530,370 A * | 6/1996 | Langhof et al. ................ 716/4 |
| 5,530,841 A | 6/1996 | Gregory et al. ................ 716/3 |
| 5,548,525 A * | 8/1996 | Albee et al. .................... 716/4 |
| 5,594,741 A | 1/1997 | Kinzelman et al. ......... 714/741 |
| 5,649,164 A | 7/1997 | Childs et al. ................. 703/16 |
| 5,684,808 A | 11/1997 | Valind ......................... 714/726 |
| 5,784,377 A | 7/1998 | Baydar et al. .............. 370/463 |
| 5,841,967 A | 11/1998 | Sample et al. ................ 714/33 |
| 5,870,590 A | 2/1999 | Kita et al. ...................... 716/4 |
| 5,905,883 A | 5/1999 | Kasuya ......................... 703/17 |
| 5,907,494 A | 5/1999 | Dangelo et al. ................ 703/1 |
| 5,920,490 A * | 7/1999 | Peters ............................ 716/6 |
| 6,006,028 A | 12/1999 | Aharon et al. ................ 703/21 |
| 6,035,109 A | 3/2000 | Ashar et al. .................... 716/3 |
| 6,044,211 A | 3/2000 | Jain .............................. 716/18 |
| 6,076,083 A | 6/2000 | Baker .......................... 706/52 |
| 6,077,304 A | 6/2000 | Kasuya ......................... 716/15 |
| 6,081,864 A * | 6/2000 | Lowe et al. ..................... 716/5 |
| 6,110,218 A | 8/2000 | Jennings ...................... 703/22 |
| 6,141,630 A | 10/2000 | McNamara et al. ......... 714/738 |
| 6,167,363 A | 12/2000 | Stapleton ..................... 703/14 |
| 6,182,258 B1 | 1/2001 | Hollander ................... 714/739 |
| 6,192,504 B1 | 2/2001 | Pfluger et al. ................. 716/1 |
| 6,212,625 B1 | 4/2001 | Russell ....................... 712/217 |
| 6,219,809 B1 | 4/2001 | Noy ............................ 714/724 |

OTHER PUBLICATIONS

Yang et al. ("Scheduling and control generation with environmental constraints based on automata representations", IEEE Transactions on Computer–Aided Design of Integrated Circuits and Systems, vol. 15, No. 2, Feb. 1998, pp. 166–183).

Cabodi et al. ("Extending equivalence class computation to large FSMs", 1995 IEEE International Conference on Computer Design: VLSI in Computers and Processors, Oct. 2, 1995, pp. 256–263).

Hsiao et al. ("Fast static compaction algorithms for sequential circuit test vectors", IEEE Transactions on Computers, vol. 48, No. 3, Mar. 1999, pp. 311–322).

Pomeranz et al. ("ACTIV–LOCSTEP: a test generation procedure based on logic simulation and fault activation", Twenty–Seventh Annual International Symposium on Fault–Tolerant Computing, 1997, FTCS–27, Digest of Papers, Jun. 24, 1997, pp. 144–151).

Mark R. Headington and David D. Riley, "Data Abstraction and Structures Using C++", D.C. Heath and Company, 1994, pp. 72–79, 144–149, 492–497, and 506–517.

Gary York, Robert Mueller–Thuns, Jagat Patel and Derek Beatty, "An Integrated Environment for HDL Verification", IEEE, 1995, pp. 9–18.

A.J. van der Hoeven, P. van Prooijen, E. F. Deprettere and P. M. Dewilde, "A Hardware Design System based on Object–Oriented Principles", IEEE, 1991, pp. 459–463.

* cited by examiner

Class Definition:

class <class name> [ extends <parent class> ]
{
<variable declarations>

<constraint blocks>          FIG. 1

<methods>
}

Coverage Definition:

coverage_def <coverage class name> (<definition state variable>, <arguments>)
{
    <coverage declarations>
    <measure of coverage>
    <coverage goal>
    coverage option = <LO/HI/CROSS_TRANS>
    <coverage initilization>
}
                  FIG. 2

State Declaration:

state  <state bin name>  ( <state specification> ) [ <conditional expression> ] ;

FIG. 3

Transition Declaration:

trans  <trans bin name>  ( <state transitions> ) [ <conditional expression> ] ;

FIG. 4

Coverage Instantiation:

<coverage class name> <coverage handle name> =
    newcov( <instance state variable>, <instance trigger> [, <optional args>] );

FIG. 5

Coverage Feedback:

query( <query command> [ , <query bin type>, <query bin pattern>
    <query operand> , <query hit> ] ) ;

FIG. 6

Coverage Feedback:

<coverage handle name> .query( <query command> [ , <query bin type>,
<query bin pattern > ,<query operand> , <query hit> ] ) ;

FIG. 7

Default Measure of Coverage:

coverage_val = 100 *
query( NUM_BIN, TRANS | STATE, ".*" , GT, 0) /
query( NUM_BIN, TRANS | STATE, ".*" );

FIG. 8

Measure of Coverage:

coverage_val = 100 *
query( <query command>, <query bin type>, <query bin pattern>, <query operand>, <query hit> ) /
query( <query command>, <query bin type>, <query bin pattern > ) ;

FIG. 9

Coverage Cross-Correlation Feedback:

<query_x return value> = query_x( <query_x param>,
<query_x handles to coverage instances> );

FIG. 10

Coverage Cross-Correlation Report:

coverage( CROSS, <coverage cross handles to coverage instances>, <coverage cross output file> );

FIG. 12

METHOD AND APPARATUS FOR ADAPTIVE VERIFICATION OF CIRCUIT DESIGNS

CROSS REFERENCE TO RELATED APPLICATIONS

This application is related to the following co-pending U.S. patent application, which was filed on the same day as the present application and all of which is herein incorporated by reference: "Method and Apparatus For Object-Oriented Verification Monitoring of Circuit Designs," filed with inventors Won Sub Kim, John Harold Downey and Daniel Marcos Chapiro, having McDermott, Will & Emery and U.S. patent Ser. No. 09/303,801

This application is related to the following co-pending U.S. patent applications, all of which is herein incorporated by reference: "Method and Apparatus For Determining Expected Values During Circuit Design Verification," filed on Mar. 31, 1999, with inventors Won Sub Kim, Valeria Maria Bertacco, Daniel Marcos Chapiro and Sandro Pintz, having McDermott, Will & Emery and U.S. patent Ser. No. 09/283,774; Method and Apparatus For Random Stimulus Generation," filed on Apr. 22, 1999, with inventors Won Sub Kim, Mary Lynn Meyer and Daniel Marcos Chapiro, having McDermott, Will & Emery and U.S. patent Ser. No. 09/298,984; "Method and Apparatus For Random Stimulus Generation," filed on Apr. 22, 1999, with inventors Won Sub Kim, Mary Lynn Meyer and Daniel Marcos Chapiro, having McDermott, Will & Emery and U.S. patent Ser. No. 09/298,986; and "Method and Apparatus For Random Stimulus Generation," filed on Apr. 22, 1999, with inventors Won Sub Kim, Mary Lynn Meyer and Daniel Marcos Chapiro, having McDermott, Will & Emery and U.S. patent Ser. No. 09/298,981.

MICROFICHE APPENDIX

This patent includes a Microfiche Appendix which consists of a total of 5 microfiche that contain a total of 442 frames.

1. Field of the Invention

The present invention relates generally to verification languages, and more particularly to language statements which monitor and query the results of the application of test data.

2. Background of the Invention

To tackle the increasing complexity of integrated digital electronic circuits, designers need faster and more accurate methods for verifying the functionality and timing of such circuits, particularly in light of the need for ever-shrinking product development times.

The complexity of designing such circuits is often handled by expressing the design in a high-level hardware description language (HLHDL). The HLHDL description is then converted into an actual circuit through a process, well known to those of ordinary skill in the art as "synthesis," involving translation and optimization. Typical examples of an HLHDL are IEEE Standard 1076-1993 VHDL and IEEE Standard 1364-1995 Verilog HDL, both of which are herein incorporated by reference.

An HLHDL description can be verified by simulating the HLHDL description itself, without translating the HLHDL to a lower-level description. This simulation is subjected to certain test data and the simulation's responses are recorded or analyzed.

Verification of the HLHDL description is important since detecting a circuit problem early prevents the expenditure of valuable designer time on achieving an efficient circuit implementation for a design which, at a higher level, will not achieve its intended purpose. In addition, simulation of the design under test (DUT) can be accomplished much more quickly in an HLHDL than after the DUT has been translated into a lower-level, more circuit oriented, description.

The verification of HLHDL descriptions has been aided through the development of Hardware Verification Languages (or HVLs). Among other goals, HVLs are intended to provide programming constructs and capabilities which are more closely matched to the task of modeling the environment of an HLHDL design than are, for example, the HLHDL itself or software-oriented programming languages (such as C or C++). HVLs permit a DUT, particularly those DUTs expressed in an HLHDL, to be tested by stimulating certain inputs of the DUT and monitoring the resulting states of the DUT.

The ability of an HVL to monitor is key for such activities as determining whether the DUT is performing as expected, or for determining the extent to which the DUT has been tested.

SUMMARY OF THE INVENTION

The present invention adds to the HVL known as "Vera" capabilities which facilitate the monitoring of a DUT.

Vera is a language which supports a programming style known as Object-Oriented Programming (or OOP). It is a programming language in which classes, and hierarchies of classes, can be defined.

Within this OOP framework, the present invention provides a monitoring facility comprised of three main stages: i) Coverage Definitions, ii) Coverage Instantiation and Triggering and iii) Coverage Feedback.

A coverage definition is very similar to a class definition, within OOP, but does not contain methods or variables. Instead, the basic purpose of a coverage definition is to declare "monitor bins" in terms of a state variable. Essentially, each monitor bin declaration has a unique bin name which is associated with a particular behavior of the state variable. This behavior can either be the state variable being in a particular state, or the state variable transitioning between a certain sequence of states. Whenever the state variable exhibits behavior that matches the particular behavior specified by a monitor bin declaration, that bin will increment a counter dedicated to that bin. If the option is so selected, the matching of a bin can also be recorded as a "bin event" which comprises an indication of the bin that was matched and a time stamp as to when the matching occurred.

Instantiation of a coverage definition produces a coverage instance, which is pointed to by a handle. When instantiating a coverage definition, two key parameters are: an actual state variable that is to be monitored by the instance and a trigger expression which determines when the state variable of the instance is to be monitored. Instantiating a coverage definition, as part of a test program's thread of control, means that a concurrent, non-terminating, "coverage instance process" is also forked off. As long as at least one handle is pointing to the coverage instance, its coverage instance process will continue. When there are no longer any references to a coverage instance, the coverage instance, and its coverage instance process, are automatically deallocated (or "garbage collected"). Until it is deallocated, the coverage instance process will monitor, "in the background," the value of the coverage instance's state variable each time the coverage instance's trigger expression is satisfied. Meanwhile, "in the foreground," the thread of control which forked off the coverage instance process may continue to operate and can, for example, subject a DUT to stimuli. The DUT's responses to such stimuli may be monitored by the coverage instance process. In particular, the coverage instance process will increment counters (or store bin events) indicating bins of its coverage instance which it determines have been matched by states of the specified state variable occurring at the trigger-expression-specified monitoring times.

The same foreground thread of control subjecting the DUT to stimuli can also determine the resulting state of the coverage instance's monitor bin counters with a "query" function. Using the "query_x" function, cross correlations between multiple coverage instances can be found. Thus the query and query_x functions make possible "closed loop" testing since the same foreground thread of control can: i) instantiate a coverage instance that forks off an associated coverage instance process, ii) generate stimuli for a DUT which will cause the counters associated with the coverage instance's monitor bins to be updated (or store bin events), iii) periodically query the contents of the coverage instance's monitor bin counters (or bin events), and iv) alter the stimuli generated for the DUT based upon the results of the query.

Advantages of the invention will be set forth, in part, in the description that follows and, in part, will be understood by those skilled in the art from the description or may be learned by practice of the invention. The advantages of the invention will be realized and attained by means of the elements and combinations particularly pointed out in the appended claims and equivalents.

BRIEF DESCRIPTION OF THE DRAWINGS

The accompanying drawings, that are incorporated in and constitute a part of this specification, illustrate several embodiments of the invention and, together with the description, serve to explain the principles of the invention:

FIG. 1 shows the general syntactic structure of a class definition;

FIG. 2 depicts the general syntactic structure for declaring a coverage definition;

FIG. 3 illustrates the general syntactic structure for a state declaration;

FIG. 4 illustrates the general syntactic structure for a transition declaration;

FIG. 5 depicts the general syntactic structure for instantiating a coverage definition;

FIG. 6 depicts a general syntactic structure for utilizing the query function to obtain information from a coverage instance;

FIG. 7 depicts another general syntactic structure for utilizing the query function to obtain information from a coverage instance;

FIG. 8 shows a default measure of coverage for a coverage definition;

FIG. 9 shows a the general syntactic structure for defining a measure of coverage for a coverage definition;

FIG. 10 depicts a general syntactic structure for utilizing the query_x function to obtain cross correlation information from coverage instances;

FIG. 12 depicts a general syntactic structure for utilizing the coverage cross function to obtain cross correlation information from coverage instances;

DETAILED DESCRIPTION OF PREFERRED EMBODIMENTS

Figure 11:
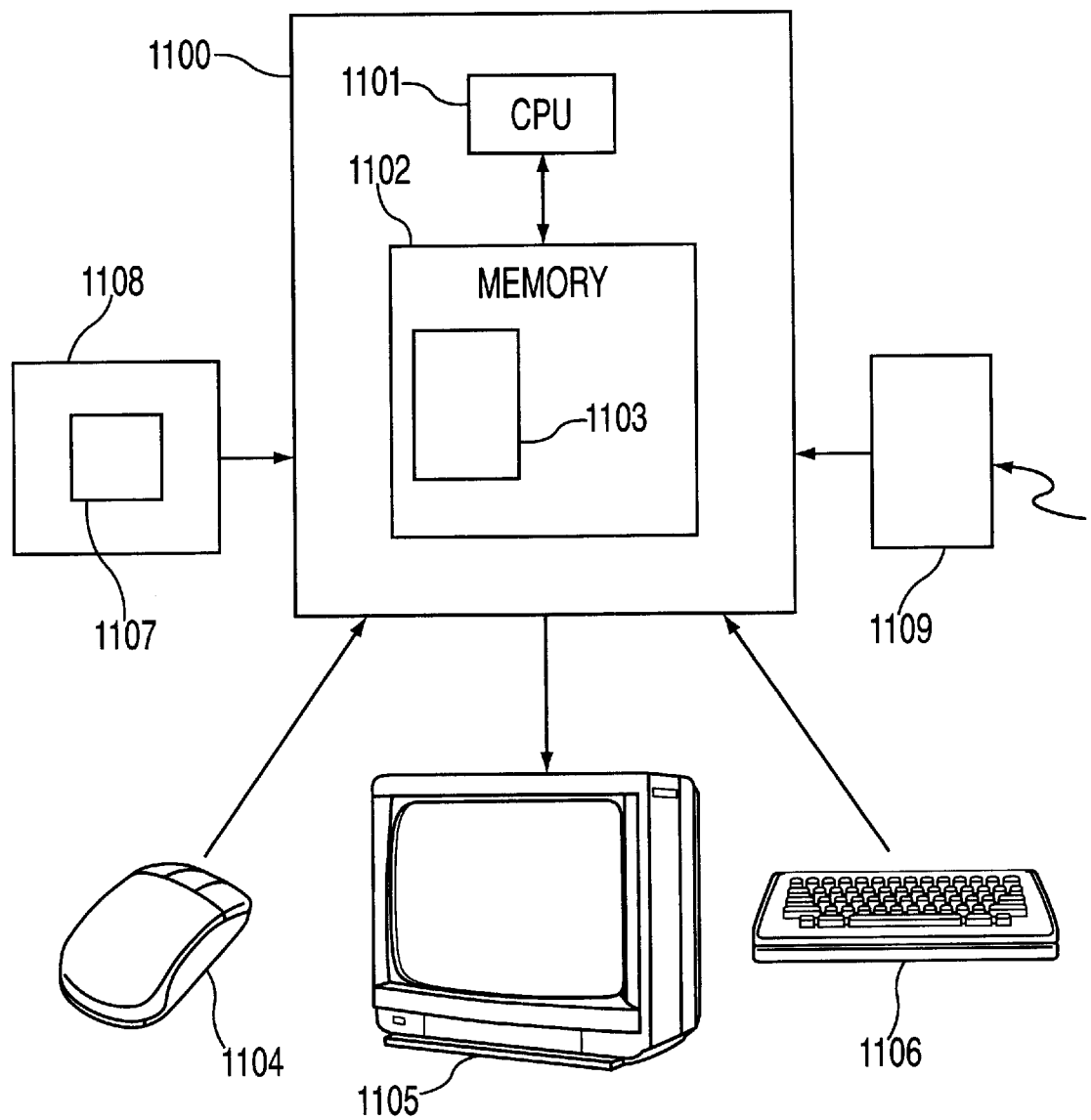
FIG. 11 shows a computing hardware environment within which to operate the present invention.

Reference will now be made in detail to preferred embodiments of the invention, examples of which are illustrated in the accompanying drawings. Wherever possible, the same reference numbers will be used throughout the drawings to refer to the same or like parts.

1. Overview re Verilog and Vera

The present invention relates to the Vera Verification System language from Systems Science Inc., Palo Alto, Calif. (which is now part of Synopsys, Inc., Mountain View, Calif., U.S.A.), hereinafter referred to as the "Vera language." A comprehensive presentation of the Vera language, and its capabilities, is presented in the Vera User's Manual which is included in the present patent as a Microfiche Appendix. As part of the verification process described above, a program written in the Vera language models the environment of the DUT by producing the test data or signals to which the DUT is subjected as well as recording or analyzing the DUT's responses. A Vera language model can be used to test any kind of DUT, provided that the appropriate interface is provided. Vera is primarily utilized, at present, with DUTs that are modeled in the Verilog HDL language (hereinafter referred to as the "Verilog language") and are being executed on an event-driven simulator. However, a Vera model could be utilized with a DUT expressed in other languages and executed on other event-driven or cycle-driven simulators. For example, the DUT could be expressed in the VHDL language. The DUT which the Vera language program is testing need not even be a software simulation. For example, the DUT to be tested could be emulated in hardware, or could even be an actual integrated circuit.

The primary usage of the Vera language, that being its usage in conjunction with an event-driven Verilog-modeled DUT, interfaces and synchronizes with a DUT as follows. This general topic of interfacing and synchronization is also discussed in the Microfiche Appendix, Chapter 1.

The Verilog simulator and the Vera simulator are both event-driven simulators that run in a synchronized fashion which may be described as a very is efficient form of co-simulation. The Verilog simulator executes a Verilog language model of the hardware device under test (DUT) while the Vera simulator executes a Vera language model of the environment in which the DUT is to be tested. As an environment simulator, the basic functionality of the Vera simulator is to stimulate the DUT by driving certain of its inputs and to monitor the resulting states of the DUT by sampling the values of its nodes.

The Vera simulator implements the Vera language in the following manner. The Vera language is a high-level object-oriented programming language. Programs written in the Vera language are first compiled into lower-level instructions in Vera assembly code. These Vera assembly code instructions are interpreted by the C or C++ routines which comprise the Vera simulator.

The co-simulation is started from the Verilog simulator side since, according to the present embodiment, the Verilog simulator is the main program started by the user and the Vera simulator is a special application which has been linked into Verilog through Verilog's interface for the high-level software-oriented programming languages of C or C++. The Verilog simulator may be any one of a variety of conventional Verilog simulators, such as VCS produced by Synopsys, Inc., or Verilog-XL produced by Cadence Design Systems of San Jose, Calif. At certain carefully controlled points in time, to be described in more detail below, the Verilog simulation is halted and the Vera simulation is run in a non-preemptive fashion.

Specifically, the Verilog simulator has a programming language interface (PLI) which allows applications written in C or C++ to communicate with the device under test (DUT) as modeled in the hardware-oriented language of Verilog. An example of such an application, that is written in C or C++, is the Vera simulator. The PLI has the following specific features. It permits Verilog language procedures to call specific C or C++ procedures. It permits C or C++ procedures (such as those which implement the Vera simulator) to establish certain nodes of the Verilog model as "callback" nodes. Whenever a node in Verilog, marked as a callback node, changes in value a specific C or C++ procedure or procedures are called. The PLI further permits C or C++ procedures to insert, at a specific time slot in the event queue of the Verilog simulator, a callback to a specific Vera procedure. In addition, the PLI provides functions through which Vera language programs can both examine the value of certain nodes in the Verilog simulation and set the value of certain Verilog nodes. While PLI functions permit Vera to immediately examine the value of certain Verilog nodes, the setting of Verilog nodes becomes a scheduled event in Verilog which is actually performed when Verilog is restarted.

The specifics of the Verilog\Vera co-simulation, and its utilization of the PLI functions described above, are as follows.

The Verilog language module first started, when the user begins the Verilog simulation, is called "vshell." vshell calls the Vera simulator procedure "vmc_init" through the PLI. vmc_init performs the following five major functions: i) it loads the Vera assembly language program to be executed by the Vera simulator, ii) it sets up certain nodes of the Verilog model as callback nodes, iii) it creates a "master" context of level 0, which we shall also refer to as "context(0)," for the execution of the main Vera language program, iv) it places context(0) on "the run queue" of the Vera simulator which holds all Vera language contexts waiting to be run and v) it calls "vera_main," the main routine of the Vera simulator. The nodes which vmc_init establishes as callback nodes in step (ii) are typically: i) the Verilog model's Vera system clock, and ii) those clocks specified by Vera language interface statements.

The Vera interface statement is a programming construct by which certain signals in the Vera model (which we shall refer to as "data" signals) are connected to certain signals in the Verilog model (which we shall also refer to as "data" signals), and the communication of information between the two models is synchronized with a single signal of the Verilog model that is defined as the clock signal for that particular interface. A Vera language program may contain multiple interfaces and each interface may have a different signal selected as its clock. If an interface does not specify a clock, then the user designated default clock node (called the "Vera system clock") is used. (The Vera system clock is a Verilog node that represents Vera's system clock.) In addition to specifying a clock, the interface statement specifies the particular edge (positive or negative) of the clock upon which each data signal of the interface is to be driven or observed. In addition, the interface can specify a certain skew time, before the selected edge of the interface's clock, at which each data signal is to be observed by Vera. The interface can also specify each data signal as being driven by Vera a certain skew time after the selected edge of the interface's clock.

The direct call by vmc_init to vera_main, rather than starting the Verilog simulation, is necessary since there may be instructions in the Vera language program that vera_main can execute before any clock events have occurred in the Verilog simulation. vera_main always begins by performing the following two major operations: i) checking the queue of contexts waiting to be executed for any contexts which, in light of the clock edge which has just occurred to cause vera_main to be called, should now be transferred to the run queue, and ii) running, in turn, each context on the run queue.

At this early point in the co-simulation's execution, the wait queue will be empty but the run queue will have the main Vera language context, context(0), created by vmc_init. context(0) will execute until it reaches a Vera construct which requires a clock edge which has not occurred yet. It is significant to note that context(0) may fork off one or more sub-contexts, which we shall refer to as context(1), context (2), . . . Each of these sub-contexts is also put on the run queue and executed until a clock edge, which has not yet occurred, is required. As each context is executed as far as it can be, without a further clock edge occurring, the context is moved from the run queue to the wait queue with a notation as to the clock edge it requires before it can continue execution. When the run queue is finally empty of contexts to execute, vera_main returns control to vmc_init. vmc_init returns control to vshell and vshell starts the main Verilog language module that is modeling the DUT.

The Verilog modules modeling the DUT execute until a change occurs to a clock node which causes the calling of a callback procedure of Vera. The Vera system clock node preferably has its own first callback procedure, independent of a second callback procedure shared by all other clock nodes as specified in Vera interface statements. This separation into two callback procedures is done in order to improve the speed of callback processing. Each of these callback procedures, however, operates as follows. First, the callback procedure determines whether the clock edge which caused the procedure to be called is of the right type (either positive or negative) for any data signal of any interface statement it serves as clock signal for. If the clock edge is of the right type for any data signal of any interface statement to which the clock is connected as the clock of that interface statement, then the callback procedure inserts into the Verilog event queue, at the end of the current time step in which the callback procedure was called (and immediately before the following the time step), a PLI call to vera_main which also contains an indication of the Verilog clock signal which changed, and the nature of the transition (positive or negative). The callback procedure then returns control to the Verilog modules simulating the DUT which will continue processing any events at the current time step of the Verilog event queue. Assuming that the callback procedure inserted a PLI call to vera_main, as soon as all events in the event queue at the current Verilog time step are exhausted, the inserted call to vera_main is executed.

When vera_main is called, through a PLI call inserted in the Verilog event queue, the clock and transition it represents is checked against the contexts waiting for a clock transition in the wait queue. As discussed above for vera_main, it will compare those contexts which are waiting to the particular clock transition which produced this call and will transfer to the run queue those contexts which are now satisfied. Each context in the run queue is then executed until all contexts have been executed as far as they can without a new clock edge and are either: i) finished, or ii) back on the wait queue. If a skew has been specified in the interface statement for data signals being used by a context, that skew is accomplished during the running of the contexts as follows. Data signals which are to be observed by Vera a certain skew time before the clock edge are observed through a delay device at the time of the clock edge. Data signals which are to be driven by Vera a certain skew time after the clock edge are driven through a delay device at the time of the clock edge. Once the run queue is empty, control is returned to the Verilog simulation at the point just after the inserted PLI call to vera_main.

While most Verilog/Nera communication is typically synchronized through interface statements as described above, there are two additional forms of synchronization: i) a Vera language specification that the Verilog simulation call the Vera simulation at some particular point in time of the Verilog simulation, and ii) a Vera language specification that the Verilog simulation call the Vera simulation upon a specified asynchronous transition of a specified signal, independent of any other clock signal. Each of these two additional forms of synchronization is handled by an additional callback procedure, in addition to the two callback procedures discussed above. As with the callback procedures discussed above, this division into two additional callback procedures is done in order to increase the speed of callback processing. Both of these two additional forms of Verilog/Nera synchronization are accomplished by having vmc_init perform some additional operations during step (ii) of the five major vmc_init functions described above. With regard to each call to Vera at a Verilog time, vmc_init through the PLI inserts in the event queue of Verilog, at the appropriate point in time, a call to a third callback procedure which is optimized for handling this type of callback situation. This third callback procedure inserts into the Verilog event queue, at the end of the time step in which the third callback procedure was called (and immediately before the following the time step), a PLI call to vera_main which also contains an indication of the time step at which Verilog has arrived. The callback procedure then returns control to the Veralog modules simulating the DUT which will continue processing any events at the current time step of the Verilog event queue before the inserted call to vera_main is executed. vera_main will then check the time passed to it against any contexts which are waiting for that time to occur before executing.

vera_main will continue executing various contexts until the run queue becomes empty, at which point control is returned to the Verilog simulation at the point just after the inserted PLI call to vera_main. With regard to the asynchronous Vera call, vmc_init through the PLI sets up these asynchronous nodes as calling a fourth callback procedure. This fourth callback procedure investigates whether the transition which has occurred is the one sought for by a particular Vera language statement and if so, inserts into the Verilog event queue, at the end of the time step in which the fourth callback procedure was called (and immediately before the following the time step), a PLI call to vera_main which also contains an indication of the node which has changed and the transition type. The callback procedure then returns control to the Verilog modules simulating the DUT which will continue processing any events at the current time step of the Verilog event queue before the inserted call to vera_main is executed. vera_main will then check the asynchronous transition indication passed to it against any contexts which are waiting for that transition to occur before executing. vera_main will continue executing various contexts until the run queue becomes empty, at which point control is returned to the Verilog simulation at the point just after the inserted PLI call to vera_main.

2. Vera Language Programming and Adaptive Verification

Vera is a language which supports a programming style known as Object-Oriented Programming (or OOP). It is a programming language in which classes, and hierarchies of classes, can be defined. A class defines both variables (also known as properties) and methods which operate upon those variables. Instances of a class are pointed to by handles and instances are created by functions known as constructors. These basic principles of OOP are well-known. How these principles operate within the Vera language are discussed in the Microfiche Appendix.

In particular, Chapter 8 introduces OOP in Vera, which needs to be read in conjunction with the other Chapters describing the Vera language. For example, methods in Vera (also referred to as subroutines) are discussed in Section 4.6 of the Microfiche Appendix. In Vera, subroutines are of two types: functions (which return a value) and tasks (which do not return a value). The built-in data types, of which variables can be declared, are covered in Chapter 3 of the Microfiche Appendix. FIG. 1 depicts the basic syntactic structure for a class definition. Note that elements of the definition surrounded by angle-brackets ("<" and ">") specify meta-variables which are to be filled in with particular information of the type described between the angle-brackets. Elements of the definition surrounded by square-brackets ("[" and "]") are optional. Therefore, in FIG. 1, "extends" is only necessary if <class name> is a child class of some <parent class>.

Among the capabilities Vera adds to the OOP approach are facilities for the generation of random data. One of these Vera capabilities, and its programming language constructs, is discussed in Chapter 9 of the Microfiche Appendix entitled "Automated Stimulus Generation." Within the class definition framework of FIG. 1, this additional capability augments the <variable declarations> and add a new area of the class definition shown as <constraint blocks>. Such random data would typically be used as stimulus for a DUT.

Another capability Vera adds to OOP, for the generation of random data, is the Vera Stream Generator of Chapter 10, Microfiche Appendix. This capability involves the definition of "randseq" blocks which are comprised of production rules written in Backus Naur Form (BNF). Instead of using BNF rules to parse bottom-up, from a programmed specification, the Vera Stream Generator runs such rules in reverse in order to generate test data. The branches of the production rules to pursue, in this top-down generation process, are determined randomly.

In addition to the ability to generate test data, critical to any verification language is the ability to monitor the values at certain nodes of the DUT at certain times. The ability to monitor is key for such activities as determining whether the DUT is performing as expected, or for determining the extent to which the DUT has been tested. The present invention adds to Vera capabilities in this crucial area of monitoring. Programming language constructs and capabilities of the Vera language used to sample a DUT's responses (as well as to evaluate whether the DUT is functioning correctly) are discussed in Chapters 4 and 11 of the Microfiche Appendix. Specifically, the present invention relates to the "Functional Coverage" facility of Chapter 11, Microfiche Appendix.

The present invention comprises three main stages: Coverage Definitions, as discussed in Section 11.2, Microfiche Appendix; Coverage Instantiation and Triggering, as discussed in Section 11.3, Microfiche Appendix; and Coverage Feedback, as discussed in Section 11.4, Microfiche Appendix. Each of these stages is discussed, generally, below.

A coverage definition is very similar to a class definition, within OOP, but does not contain methods or variables. Instead, the basic purpose of a coverage definition is to declare "monitor bins" in terms of a state variable. Essentially, each monitor bin declaration has a unique bin name which is associated with a particular behavior of the state variable. This behavior can either be the state variable being in a particular state, or the state variable transitioning between a certain sequence of states. Whenever the state variable exhibits behavior that matches the particular behavior specified by a monitor bin declaration, that bin will increment a counter dedicated to that bin. If the option is so selected, the matching of a bin can also be recorded as a "bin event" which comprises an indication of the bin that was matched and a time stamp as to when the matching occurred.

Instantiation of a coverage definition produces a coverage instance, which is pointed to by a handle. When instantiating a coverage definition, two key parameters are: an actual state variable that is to be monitored by the instance and a trigger expression which determines when the state variable of the instance is to be monitored. Instantiating a coverage definition, as part of a test program's thread of control, means that a concurrent, non-terminating, "coverage instance process" is also forked off. As long as at least one handle is pointing to the coverage instance, its coverage instance process will continue. When there are no longer any references to a coverage instance, the coverage instance, and its coverage instance process, are automatically deallocated (or "garbage collected"). Until it is deallocated, the coverage instance process will monitor, "in the background," the value of the coverage instance's state variable each time the coverage instance's trigger expression is satisfied. Meanwhile, "in the foreground," the thread of control which forked off the coverage instance process may continue to operate and can, for example, subject a DUT to stimuli. The DUT's responses to such stimuli may be monitored by the coverage instance process. In particular, the coverage instance process will increment counters (or store bin events) indicating bins of its coverage instance which it determines have been matched by states of the specified state variable occurring at the trigger-expression-specified monitoring times.

The same foreground thread of control subjecting the DUT to stimuli can also determine the resulting state of the coverage instance's monitor bin counters with a "query" function. Using the "query_x" function, cross correlations between multiple coverage instances can be found. Thus the query and query_x functions make possible "closed loop" testing since the same foreground thread of control can: i) instantiate a coverage instance that forks off an associated coverage instance process, ii) generate stimuli for a DUT which will cause the counters associated with the coverage instance's monitor bins to be updated (or store bin events), iii) periodically query the contents of the coverage instance's monitor bin counters (or bin events), and iv) alter the stimuli generated for the DUT based upon the results of the query.

Each of these stages of coverage definition, coverage instantiation and coverage feedback will now be discussed in greater detail.

2.1 Coverage Definition

The basic syntax for a coverage definition is shown in FIG. 2. <coverage class name> serves the same role as <class name> in a class definition. <definition state variable> is a parameter name for specifying the type of monitoring which is to be done when an actual state variable to be monitored is given as part of the coverage definition's instantiation. <coverage declarations> are used to declare legal states, illegal states, legal transitions and illegal transitions whose occurrence is to be monitored by being associated with bin names. The syntax and semantics of <coverage declarations> is described in Section 11.2.2, Microfiche Appendix. Below is discussed the general syntax and semantics for such declarations.

The basic syntax for a state declaration is shown in FIG. 3. As can be seen, a state declaration consists of the following four portions: i) the keyword "state," ii) the name of the bin to be updated by this declaration (<state bin name>), iii) a specification of the state or states (<state specification>) which, when one of them matches the current state of <definition state variable>, will cause the counter associated with <state bin name> to be updated and iv) an optional <conditional expression> which, if specified, must also be true, in addition to the <state specification> matching the current state of <definition state variable>, in order for the counter associated with <state bin name> to be updated (or for a state declaration bin event to be recorded, as discussed further below).

The specification for illegal states is very similar to a state declaration. A major difference of an illegal state declaration (which uses the keyword "bad_state" rather than "state") is that the <state specification> can take the special keywords "not state" which match to any state of <definition state variable> which has not been declared in a state declaration. This provides a convenient mechanism for monitoring any entry into illegal states.

The basic syntax for a transition declaration is shown in FIG. 4. As can be seen, a transition declaration consists of the following four portions: i) the keyword "trans," ii) the name of the bin to be updated by this declaration ("<trans bin name>), iii) a specification of the state transition or transitions (<state transitions>) which, when one of the transition sequences it specifies is finally matched by the latest transition of <definition state variable>, will cause the bin <trans bin name> to be updated and iv) an optional <conditional expression> which, if specified, must also be true, in addition to the <state transitions> being matched by a sequence of <definition state variable>, in order for <trans bin name> to be updated (or for a transition declaration bin event to be recorded, as discussed further below).

The specification for illegal transitions is very similar to a transition declaration. A major difference of an illegal transition declaration (which uses the keyword "bad_trans" rather than "trans") is that the <state transitions> specification can take the special keywords "not trans" which match to any state transition which has not been declared in a transition declaration. This provides a convenient mechanism for monitoring any occurrence of illegal transitions.

The <measure of coverage> and <coverage goal> portions of a coverage definition are discussed below, in conjunction with a discussion of coverage feedback.

"coverage_option" allows the specification of the options LO, HI or CROSS_TRANS. LO specifies that the counters associated with each monitor bin are to be incremented upon a coverage declaration (state, bad_state, trans or bad_trans) being matched. This is the default form of coverage instance monitoring and is described above. The HI option specifies that not only will the counters associated with each monitor bin be incremented, upon a coverage declaration being matched as occurs with a LO option, but that each matching of a state declaration will be recorded as a "bin event." A bin event comprises both an indication of a state declaration having been matched and a time stamp indicating the simulation time at which the matching occurred. A time stamp, as defined in the present patent, is preferably specified in terms of the finest time ticks (such finest time ticks known as "ticksize" in the simulator art) by which the simulation time is measured. The HI option specifies that only bin events relating to state declarations be recorded. If CROSS_TRANS is specified in conjunction with HI (by use of the "+" or "|" operators), then any matching of a transition declaration is also recorded as a bin event. As with a state declaration, a transition declaration bin event comprises both an indication of the transition declaration matched and a time stamp indicating the simulation time at which the last transition in the transition sequence occurred.

2.2 Coverage Instantiation

The basic syntax for coverage instantiation is shown in FIG. 5. It comprises the six following main parts: i) a specification of the coverage definition (<coverage class name>) to be instantiated, ii) a specification of the handle for pointing to the instance (<coverage handle name>), iii) an assignment operator ("="), iv) an invocation of the "newcov" constructor function, v) a specification of the variable to be monitored by the coverage instance (<instance state variable>), and vi) a specification of the expression (<instance trigger>) to be used for triggering monitoring of <instance state variable> by the coverage instance. Note that parts i) and ii) may be done as one step, in which a handle of the type required by the coverage definition is created, without having that handle point to an instance. Parts ii) through vi) are then done as a second step in which an actual coverage instance is created by the "newcov" and it is assigned to the previously created handle.

The <instance state variable> can actually be a general Vera language expression, rather than just a variable, so long as it evaluates to a value which can then be matched to the appropriate state declarations or transition declarations.

The <instance trigger> can be any one of the following.

It can be a synchronization operator, per Section 4.4.1, Microfiche Appendix. If Vera is being operated in conjunction with Verilog, then the synchronization operator can specify any clock or data signal of a Vera language interface statement. In this case, the clock, or the clock associated with the specified data signal (by virtue of the data signal's interface statement), is used to trigger monitoring of <instance state variable> by the coverage instance pointed to by <coverage handle name>. If Vera is being operated in stand-alone mode, then a "clock," generated by Vera itself, can be used in conjunction with the synchronization operator.

The <instance trigger> can also be changes to a Vera language variable with the "wait_var( )" construct of Section 6.1.1.2, Microfiche Appendix. Generally, the wait_var function "blocks" (i.e., stops the flow of control) until the Vera language variable it specifies has changed in value.

Finally, the <instance trigger> can be the occurrence of a Vera language defined "event" which we shall refer to as a "Vera language event." Vera language events are discussed in Section 6.2 of the Microfiche Appendix. Generally, there is a special Vera language data type "event" used for defining Vera language event variables that are set by one process with a "trigger" function. Another process then detects the setting with a "sync( )" function. The <instance trigger> uses the sync( ) function.

2.3 Coverage Feedback

The "query" method is called according to the syntax of FIG. 6. Its syntax is covered in detail in Section 11.4, Microfiche Appendix. It permits accessing the data stored in the counters associated with the monitor bins of a coverage instance. The "query" method can be called in two main ways: i) at any point in a Vera language program, where it is appropriate to call a method, the syntax shown in FIG. 7 may be used, or ii) within the <conditional expression> of a coverage declaration the syntax of FIG. 6 may be used since its application to the "this" handle is implied. The implied "this" handle points to the coverage instance of which the <conditional expression> making the query call is a part. The <query command> portion of the query method call can be as follows.

Specifying NUM_BIN for <query command> counts the number of bins of the coverage instance. <query bin type> can be used to limit the counting to any one, or all of, STATE, BAD_STATE, TRANS, or BAD_TRANS. Other optional additional arguments with NUM_BIN are: <query bin pattern>, <query operand>, and <query hit>. <query bin pattern> is any regular Perl expression which the user can program to match the names of a desired subset of state or transition declaration monitor bin names (e.g. <state bin name>, an illegal state bin name, <trans bin name> or an illegal transition bin names). <query operand> can be any one of GT (greater than), GE (greater than or equal), LT (less than), LE (less than or equal), EQ (equal to) or NE (not equal to). <query hit> specifies a number of counter hits to which the queried bins are compared using <query operand>. In other words, only bins whose counters stand in relation <query operand> with respect to <query hit> are selected as being the subject of the query.

Specifying SUM for <query command> operates the same as NUM_BIN, except that rather than returning a count of the number of monitor bins whose counters meet the requisite qualifications, the sum of the counters which meet the requisite qualifications is returned.

Specifying FIRST for <query command> operates the same as SUM, except that rather than returning a sum of the counters which meet the requisite qualifications, the count of the counter for the first monitor bin which meets the requisite qualifications is returned.

Specifying NEXT for <query command> operates the same as FIRST, except that rather than returning the count of the counter for the first monitor bin which meets the requisite qualifications, the count of the counter for the next monitor bin (in the sequence started by the last use of FIRST) is returned.

Specifying GOAL for <query command> returns a "1" if <coverage goal> (of coverage definition) has been satisfied and a "0" otherwise. <coverage goal> specifies a percentage between 0 and 100. <measure of coverage> (of coverage definition) is an expression which determines the percentage of monitor bin counters that satisfy a particular requisite qualification with respect to some specified population of monitor bin counters. GOAL causes <coverage goal> to be compared to <measure of coverage>, and if <measure of coverage> is greater than or equal to <coverage goal>, then the <coverage goal> has been satisfied and a "1" is returned.

The default form of <measure of coverage> is shown in FIG. 8. This default expression determines the percentage of bin counters with a count greater than zero with respect to the population of all bin counters (declared by a state or transition declaration). In general, the Vera language programmer can specify any expression of the form shown in FIG. 9. The <query command>'s in the query's of FIG. 9, should be either NUM_BIN or SUM.

The "query_x" function, shown in FIG. 10, determines cross correlation information between two or more coverage instances passed to it. It is discussed in Section 3.4 of this patent.

The "coverage" function is shown in FIG. 12, which can find cross correlation between two or more coverage instances passed to it. It is discussed in Section 3.4 of this patent.

2.4 Stimulus Generation For Closed Loop Testing

As discussed above, the query and query_x functions make possible "closed loop" testing since the same foreground thread of control can: i) instantiate a coverage instance (or instances) that forks off an associated coverage instance process (or processes), ii) generate stimuli for a DUT which will cause the counters associated with the coverage instance's monitor bins to be updated (or store bin events), iii) periodically query the contents of the coverage instance's monitor bin counters (or bin events), and iv) alter the stimuli generated for the DUT based upon the results of the query.

Figure 13:
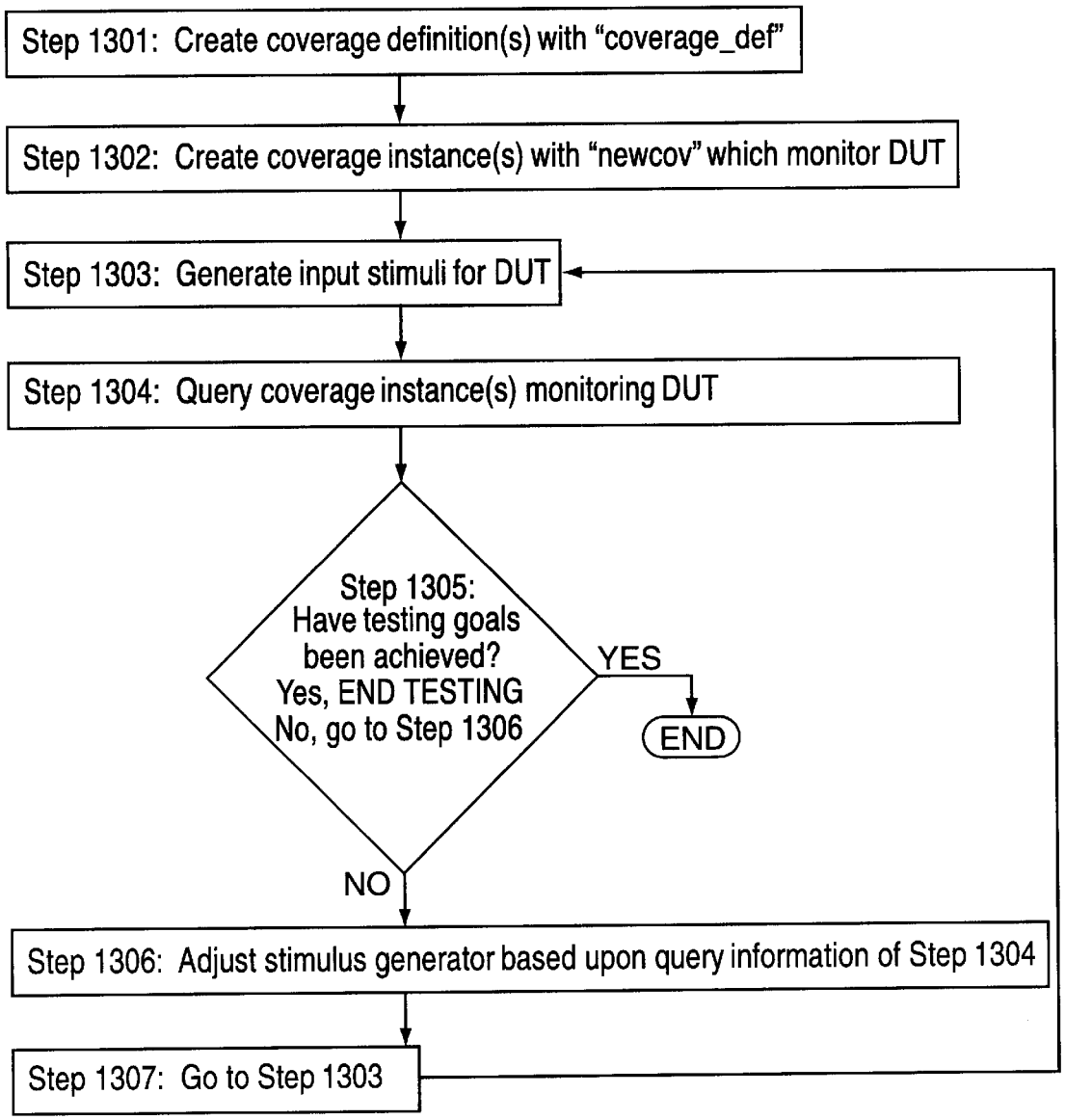
FIG. 13 illustrates a closed loop adaptive verification flow chart.

The overall process by which closed loop testing is achieved is depicted in FIG. 13. First, coverage definitions are defined with "coverage_def." Step 1301. This is accomplished by a Vera language programmer actually writing a Vera language program and then compiling it. The rest of the steps of FIG. 13 are accomplished at "run time" when the Vera simulator is running. Next, coverage instances (and their coverage instance processes) are created with the "newcov" function. Step 1302. These coverage instance processes monitor the DUT. These first two steps are prepatory to the actual closed loop process. In Step 1303 a generator is utilized to subject the DUT to stimuli. The DUT's responses to the stimuli are implicitly monitored by the coverage instance processes. The responses of the DUT are gathered by the query functions. Step 1304. The results of the query are then evaluated. Step 1305. If the testing goals have been satisfied, then testing ends. If not, however, then the stimulus generator may be adaptively adjusted, based upon the results of the query. Step 1306. With the stimulus generator having been adjusted, it is once again commanded to generate more stimuli for the DUT. Step 1303. Eventually, the process of adjusting the stimulus generator is intended to finally achieve the testing goals such that the loop will end.

Of assistance to the accomplishment of Steps 1303 and 1306 of this closed loop process is a stimulus generator whose output can be conveniently adjusted.

One such generator is provided by the random stimulus facilities discussed in Chapter 9 "Automated Stimulus Generation," Microfiche Appendix.

Another such generator is provided by the production-based facilities discussed in Chapter 10 "Vera Stream Generator," Microfiche Appendix. The Vera Stream Generator provides for the definition of "randseq" blocks. A randseq block is a Vera language programming statement that is executed whenever encountered in the course of a Vera program's normal flow of control. Within a randseq block a grammar of production rules in Backus Naur Form is defined. When a randseq block is executed, it begins at a production, indicated as the start production, and proceeds down the grammar hierarchy (as opposed to conventional programming language parsing which proceeds upwards from the lowest level lexical tokens) in order to eventually generate the lowest level "lexical tokens." Where there is a choice as to which path down the hierarchy to take, a path is chosen randomly. The "lexical tokens" of a randseq grammar are generated by attaching "actions" to the performance of a production. These actions can use virtually any Vera language programming constructs in order to generate data necessary to exercise the DUT. Thus far it has been described how the Vera Stream Generator can implement a generator in accordance with step ii) of the above closed-loop process. Step iv) of the closed-loop process is accomplished by the ability to have "weights" attached to the randseq productions. Where there is a choice as to which path down the hierarchy to take, the randomly chosen path is influenced by the weights assigned to a production. These weights can be changed, under program control, prior to the execution of the randseq block. Therefore, in response to a query or query_x of a coverage instance (or instances), the closed-loop process can adjust the production weights and re-execute the randseq block (or blocks) with the likelihood that different data will be sent to the DUT.

3. Coverage Instance Implementation 3.1 Instantiation and Triggering

In terms of the VerilogNera interfacing and synchronization, described above in Section 1 of this patent, coverage instantiation operates as follows.

When a context, call it context(X), reaches a coverage instantiation statement (i.e., a "newcov" function), while being processed by vera_main on the run queue, the following happens. A context for the coverage instance, call it context(X_coverage1), is forked off and put on the run queue for execution after context(X). The "context" created for the coverage instance is simply another terminology for referring to the "coverage instance process" discussed above. The "context" terminology is intended to follow, more uniformly, the terminology of the discussion in Section 1 of this patent. When context(X_coverage1) is run it determines the context-triggering event needed by its <instance trigger>, as specified in the instantiation, and vera_main moves context(X_coverage1) to the wait queue. It waits there for its context-triggering event in the same manner as any non-coverage context.

The execution of the "newcov" function also creates the actual "coverage instance," referred to by its associated with context(X_coverage1). This coverage instance contains a wide arrange of information necessary for processing the instance. For example, the coverage instance contains the bin counter variables. Another example of information contained in the coverage instance are the data structures (discussed below in Section 3.2 of this patent) for organizing the linear or hierarchical search of coverage declarations when a value of the <instance state variable> is to be matched to a <state specification> or <state transitions>. The coverage instance also keeps the file pointer to the file where its bin events are stored. In addition, the coverage instance stores <measure of coverage>, <coverage goal>, and coverage option. The coverage instance contains a reference to its defining "coverage_def." The values of the <instance state variable>, as it is sampled according to the <instance trigger>, are stored in the coverage instance. The coverage instance also contains the values of any <optional args> passed to it, as of the time of instantiation with newcov, and the name of the original handle to which the coverage instance was assigned when instantiated. The coverage instance does contain a reference to its context(X_coverage1), permitting deletion of its context when the coverage instance is deallocated. As mentioned above, the context(X_coverage1) refers to the coverage instance and it is the context(X_coverage1) which controls the execution of the code which performs updating of the bin counters or the writing of bin events.

In the case of a Vera language variable change acting as a coverage context trigger, a context-triggering event is created as follows. The instantiation of a context(X_coverage1) that includes a "wait_var" function as its <instance trigger> causes the variables specified by wait_var to be monitored. After this instantiation, suppose there is running a non-coverage instance context(Z) which causes a variable, that is a parameter of the wait_var <instance trigger>, to change. This change produces a Vera language "wait_var event" which is held in an "event holding area." Events in the event holding area cause waiting contexts to be triggered as discussed below.

In the case of a co-simulation with Verilog, the coverage and non-coverage instance contexts are triggered as follows. The following description begins from the point in time where the Verilog simulation is executing and the Vera simulation is suspended.

While Verilog is executing, vera_main is suspended and its run queue is empty. When a change occurs to a clock node which causes the calling of a Vera callback procedure, vera_main is called (as discussed in Section 1 above) and it determines which contexts, on the wait queue, are triggered by this Verilog clock edge. In general, there are Y contexts moved from the wait queue to the run queue. As discussed above, each of these Y contexts executes as far as it can go until another context-triggering event is required, at which point it is moved back to the wait queue. Also as discussed above, each of these Y contexts may fork off additional contexts which are capable of being executed immediately. Such additional contexts shall be referred to as "intra-run queue forks" and are placed in the run queue for execution after the forking context. As discussed above in Section 1, all these contexts (whether transferred to the run queue because of a Verilog clock edge or because of an intra-run queue fork) will execute until they require another context-triggering event, at which point they will be transferred back to the wait queue. Once all of these contexts have finished executing, the run queue will again become empty. Let use assume that the Y contexts triggered a total of X additional contexts (through intra-run queue forks) before the run queue became empty again. The total number of contexts which have been run, therefore, as a result of the last Verilog clock node change, is X+Y which we shall call M.

According to the discussion in Section 1 above, once these M contexts have finished executing, vera_main would return control to the Verilog simulation. However, these M contexts may have generated "intra-Vera language events" (such as a Vera language variable, being monitored by the wait_var function, changing value, or a Vera language event occurring because of the "trigger" function). Such intra-Vera language events are held in an event holding area. Once the M contexts have finished executing, vera_main determines which of the contexts on the wait queue are triggered by these intra-Vera language events and moves them to the run queue. We will define as Y2 the number of contexts triggered by these intra-Vera language events. These contexts, just like the Y contexts triggered by a Verilog clock node, may themselves cause intra-run queue forks. We will define as X2 the number of intra-run queue forks triggered by the Y2 contexts. Thus the total number of contexts run, either directly triggered by intra-Vera language events, or indirectly by their intra-run queue forks, is Y2+X2=M2. Once these M2 contexts have finished running, vera_main will iteratively re-examine whether any additional contexts on the wait queue may now be triggered by any intra-Vera language events produced by the M2 contexts.

These iterations, of finding all waiting contexts triggered by a Verilog clock edge, or by intra-Vera language events, and then running them until the run queue is empty again, is referred to as an intra-Vera language sub-cycle. Certain intra-Vera language events will persist across intra-Vera language sub-cycles, while others will not. Some intra-Vera language events can even persist across Verilog clock edges. The extent of persistence is determined by the semantics desired at the Vera language level.

Through the entire process described above, including from the time when Y contexts are initially triggered by a Verilog clock, it must be noted that the following special processing is done when the context to be executed is a coverage instance context. Before each context is executed, but after it has been placed on the run queue, a test is made to determine whether the context is a coverage instance context. If it is, then rather than executing the context, it is moved from the run queue to a coverage queue. Processing then continues with the next context on the run queue.

Eventually, after the completion of a certain number of intra-Vera language sub-cycles, there will either be no intra-Vera language events caused by that intra-Vera language sub-cycle, or there will be no waiting contexts triggered by those intra-Vera language events.

In either case, the only contexts vera_main will still have to execute, before returning control to the Verilog simulation, will be those coverage contexts it has placed on the coverage queue throughout the various intra-Vera language sub-cycles. At this point, vera_main moves all of the coverage instance contexts on the coverage queue to the run queue. vera_main iteratively executes each coverage instance context, as described in Section 3.2 below, until a context-triggering event is once again needed and the context is then put back on the wait queue. Once all the coverage instance contexts have been run, vera_main then returns control to the Verilog simulation.

If the Vera simulation is operating in stand-alone mode, then in the point of the above description where both the run queue and the coverage queue are empty (i.e., all possible intra-Vera language sub-cycles have been executed and the coverage queue has been completely processed) vera_main would generate its own "clock edge."

Having the coverage contexts execute last provides a predictable standard around which the testing designer can construct tests such that the desired observations are made. If the coverage context is simply monitoring a stopped Verilog simulation, then the fact of its execution as the last context in response to a context triggering event is not relevant. However, if the coverage context is monitoring other contexts, then the order of the coverage context's execution does effect the values monitored.

For example, rather than having a coverage object triggering directly upon a Verilog model, it may be desirable to have another Vera language procedure monitor the Verilog model. This Vera language procedure could monitor, for example, for a very complex sequence of actions by the Verilog model before the Vera language procedure would set some intra-Vera language event such as a Vera language event or a wait_var event. The coverage object would then trigger upon this intra-Vera language event.

Another example is several Vera-language contexts and a coverage context each triggering off the same context triggering event and therefore all being on the run queue at the same time. Each of the several Vera-language contexts increment a global variable "i," while the coverage context monitors the value of global variable "i." If the coverage context did not execute last, the value of "i" it monitors would be different depending upon when the coverage context's execution is interspersed with the execution of the several Vera-language contexts.

3.2 Execution of Coverage Instance

Execution of a coverage instance's context(X_coverage1) causes searches to be performed through the coverage declarations which have been defined. These searches look for any coverage declarations that should be performed due to their states or state transitions matching the value of <instance state variable> as of the last occurrence of <instance trigger> (as well as, of course, any <conditional expression> being executed and found to evaluate to TRUE).

The coverage declarations are divided according to the four types (state, bad_state, trans and bad_trans declarations) and each of these types are searched separately.

Each search of a type of declaration may itself consist of up to two searches, with one of the searches being linear and the other hierarchical. Any declarations which are "complex" are placed in a linear (or sequential) structure for searching. If there are four or more "simple " declarations, then the simple declarations are placed in a hierarchical structure for searching. If there are less than four simple declarations, then the simple declarations are placed in the same linear structure used for complex declarations.

A state declaration's or a bad_state declaration's <state specification> is simple if it consists of just a single Vera expression which evaluates to a single value. If a <state specification> is not simple, then it is complex.

A trans declaration's or a bad_trans declaration's <state transitions> is simple if the following three conditions are true: i) it consists of only one state sequence, ii) the sequence has only two states and iii) both of the states are simple according to the definition just given above for a simple <state specification>. If a <state transitions> specification is not simple, then it is complex.

As a further optimization of the search process, certain kinds of overlap between coverage declarations are checked for at instantiation time. Specifically, overlap between coverage declarations of the same type is checked for. If no overlap is found, then the coverage instance process is able to immediately end its search through the coverage declarations, of each of these four declaration types, as soon as it finds one coverage declaration that is matched. This is permissible since this type of no-overlap means that only one coverage declaration, of a particular type, can be matched by any one state or state transition.

During the execution of a coverage instance context(X_coverage1), for each coverage declaration which it determines is matched, it will update its associated counter. These counters are essentially unsigned integer variables of the coverage instance in the same way as integer variables comprise an ordinary OOP instance. If the appropriate coverage option is set, then in addition to incrementing its associated counter, each matched coverage declaration also records a bin event. As discussed above, a bin event comprises both an indication of the monitor bin matched and a time stamp with the simulation time at which the matching occurred. An actual bin event is composed of three pieces of information: a handle to identify the monitor bin matched, the type of the monitor bin matched and a time stamp. The "handle" of a bin event is simply a unique identifier for the <state bin name> or <trans bin name> matched. A handle is more storage efficient than storing the actual bin name. The type of the monitor bin is either "state" or "trans" since bin events are not stored for bad_state or bad_trans. The bin events of each coverage instance are written in chronological order to its own file.

3.3 Querying of Coverage Instance

Querying of a coverage context, which we shall refer to as context(X_coverage1), by a context containing a query statement, which we shall refer to as context(Q), proceeds as follows. context(Q), once on the run queue, accesses the relevant data storage areas of context(X_coverage1), with context(X_coverage1) acting, from the perspective of context(Q), as a static database. There is no execution of any of the methods associated with context(X_coverage1) as a result of it being accessed by context(Q). This situation is true even if context(Q) and context(X_coverage1) are both triggered by the same context triggering event. In this case, since context(X_coverage1) is executed after context(Q), the data of context(X_coverage1) which is viewed by context(Q) is the data in context(X_coverage1) after the last context triggering event occurred to trigger context(X_coverage1). By definition, context(X_coverage1) will be updated as a result of the context triggering event after context(Q) has made its query. context(X_coverage1) and context(Q) can be the same context, in the case where the <conditional expression> of a coverage declaration contains a query method call of the form shown in FIG. 6 and discussed above. We shall refer to the particular coverage declaration containing the query method call as "coverage declaration X." No <coverage handle name> needs to be specified, since it is implicitly a method call upon the current coverage instance itself (also known as a "this" handle, see Microfiche Appendix, Section 8.7). If the query is being made of the bin counter associated with the coverage declaration X itself, then the value returned by query is based upon the un-updated value of the bin counter. If the query is being made of the bin counter associated with some other coverage declaration than coverage declaration X, then it is indeterminate whether the value utilized by query is based upon the updated or un-updated value of the bin counter. A query within the context for a particular coverage instance cannot reference any bin counters associated with any other coverage instance.

3.4 Cross Coverage Determinations

Cross coverage determinations examine cross correlations between coverage instances. In particular, they examine cross correlations between the bin events of multiple coverage instances.

A coverage instance $X\_1$ is considered to be "in" a particular state declaration bin $S\_1$ from the time stamp of a bin event indicating the state declaration bin name $S\_1$, until the time increment immediately before (one "ticksize" before) the next state declaration bin event for $X\_1$ indicating a state declaration bin name other than $S\_1$.

A coverage instance $X\_1$ is considered to be "in" a particular transition declaration bin $T\_1$ from the time stamp of a bin event indicating the transition declaration bin name $T\_1$, until the time increment immediately before (one "ticksize" before) the next transition declaration bin event for $X\_1$ indicating a transition declaration bin name other than $T\_1$.

More generically, a coverage instance $X\_1$ is "in" a declaration bin when it is either in a state declaration bin, as defined above, or a transition declaration bin, as defined above.

Having defined when a coverage instance is "in" a declaration bin, it is now possible to define "cross correlation." Assume a coverage instance $X\_1$ is in a declaration bin B_1, for a time period D_1, where B_1 is either a state or transition declaration bin. Assume a coverage instance X_2 is in a declaration bin B_2, for a time period D_2, where B_2 is either a state or transition declaration bin. D_1 and D_2 are each composed of two values: a start time and a stop time, as described above. The fact of coverage instance X_1 being in bin B_1 is cross correlated with the fact of coverage instance X_2 being in bin B_2 if time periods D_1 and D_2 have an overlap of at least one smallest time tick (wherein the smallest time tick is of size "ticksize"). Note that the "query x" function, discussed below, does not count, as a valid cross-correlation combination, the case where coverage instance X_1 and coverage instance X_2 are both in transition declaration bins. More generally, query_x requires that every combination of declaration bins must include at least one state declaration bin.

3.4.1 query_x Function

The "query_x" function, shown in FIG. 10, determines cross correlation information between two or more coverage instances passed to it. The type of cross correlation information determined is controlled by parameter <query_x param>, while a list of two or more handles to the coverage instances to be cross analyzed is passed as parameter <query_x handles to coverage instances>.

If <query_x param> is MAX_COM, then <query_x return value> is an integer representing the maximum number of possible combinations bins which the coverage instances passed to query_x may be "in" at the same time. More specifically, the value returned by MAX_COM is as follows. Consider an invocation of query_x with n coverage instances passed to it, where i is a particular instance among the n. Each coverage instance i has a number of state monitor bins, represented by $state\_bins_i$, and a number of transition monitor bins, represented by $trans\_bins_i$. MAX_COM is then determined by the following equation:

$$MAX\_COM=(state\_bins_1+trans\_bins_1+1)\times(state\_bins_2+trans\_bins_2+1)\times \ldots (state\_bins_n+trans\_bins_n+1)\ trans\_bins_1 \times trans\_bins_2 \times \ldots trans\_bins_n$$

In the above MAX_COM equation it is important to note that for any coverage instance i, if the coverage option CROSS_TRANS is not specified, then the value for $trans\_bins_i$ is zero. The addition of one extra "monitor bin" per summation term, in the above formula, corresponds to the "UNKNOWN" (see below) initial state of each coverage instance before the first <instance trigger> occurs. Note that since bin events are not stored for bad_state or bad_trans declarations, they do not effect cross correlation determinations.

If <query_x param> is NUM_DET, then <query_x return value> is an integer representing the total number of combinations that have actually occurred while the coverage instances passed to query_x have been monitoring. NUM_DET is determined as follows.

Each of the n coverage instances, passed to query_x, has its own file, called a "bin event file," where the monitor bin events each instance has detected are stored in chronological order. query_x proceeds through all of the n files in a breadth-first, chronological fashion (to be described in greater detail below), detecting cross-correlations between the coverage instances and storing each of these combinations in a "combinations_hash_table." Each entry in the combinations_hash_table represents a unique combination. In general, if a combination among the instances is detected multiple times, for each time it appears it is simply stored into the combinations_hash_table once. A single, complete scan is then made of the combinations_hash_table to determine the total number of unique combinations which has occurred and this is returned as the NUM_DET value.

Figure 14:
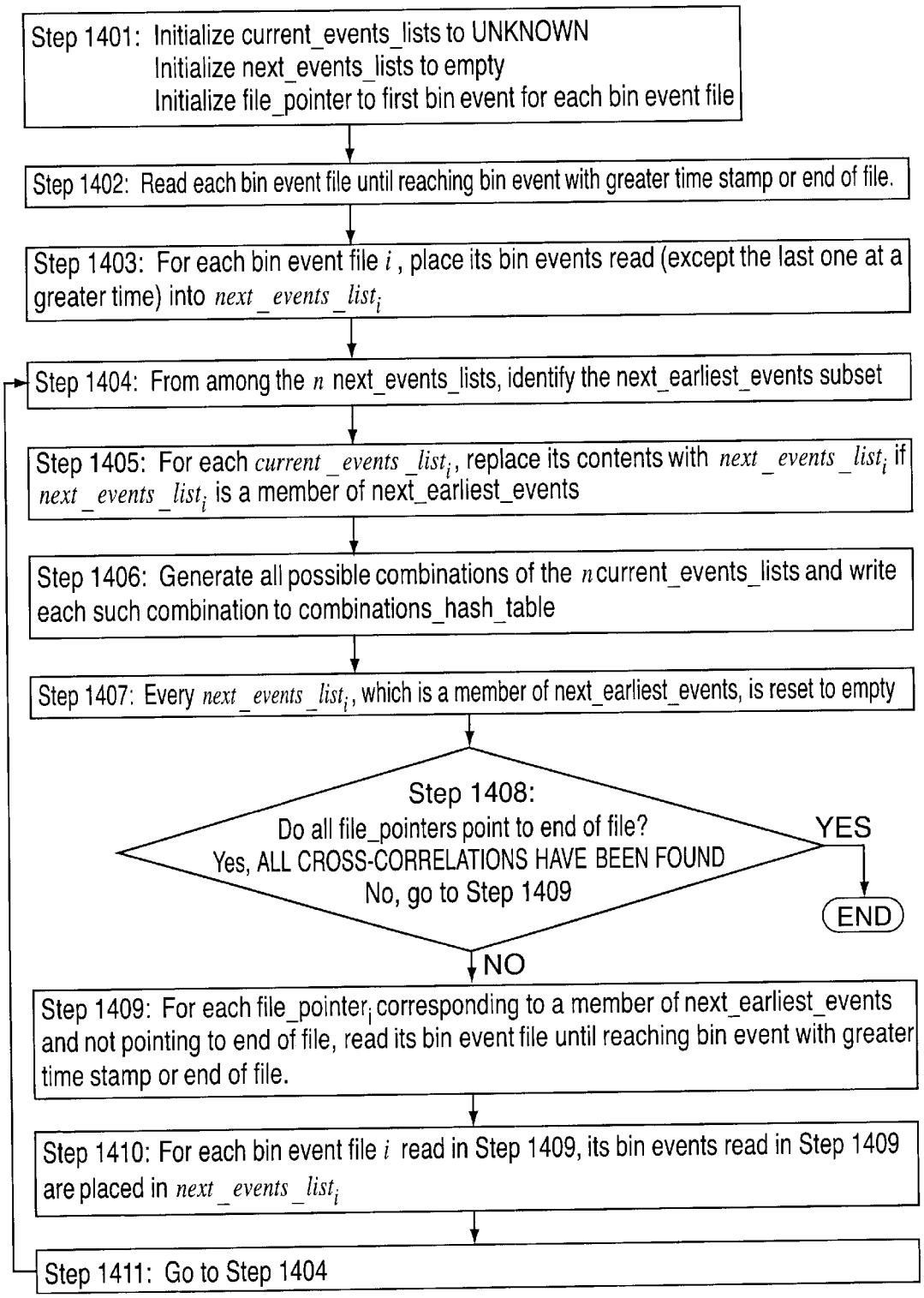
FIG. 14 depicts a flow chart for finding all the cross-correlated combinations among n bin event files.

If <query_x param> is PERCENT, then <query_x return value> is an integer representing 100 times NUM_DET/MAX_COM.

query_x detects cross correlations across n bin event files as follows. The following steps are also shown in FIG. 14.

Any bin event file, among the n bin event files, shall be referred to as "bin event file i," where $1 \leq i \leq n$. Each bin event file i has a $current\_events\_list_i$ and a $next\_events\_list_i$. All n $current\_events\_list_i$ are initialized to contain a special event "UNKNOWN." All n next_events_lists are initialized to be empty. Each bin event file i has a "file_$pointer_i$," pointing to a particular bin event. Each file_$pointer_i$ is initialized to point to the first bin event in its bin event file. See initializations of Step 1401, FIG. 14.

For each bin event file i, read the bin event pointed to by its file_$pointer_i$, and all successive bin events in the file, until reaching either: i) the first bin event whose time stamp is greater (greater, that is, than the time stamp of the first bin event read when the read began), or ii) the end of file. Step 1402, FIG. 14. All of the bin events read, for each bin event file i, except the last bin event which is at the greater time stamp, are placed in its $next\_events\_list_i$. Step 1403.

From the set of n next_events_lists, a subset is identified of all those next_event_lists whose bin events all occur at the earliest, and identical, time stamp time. Step 1404. This subset is referred to as the "next_earliest_events" subset.

For each $current\_events\_list_i$, replace its contents with the contents of $next\_events\_list_i$ if the $next\_events\_list_i$ is a member of the next_earliest_events subset. Step 1405. Note that this leaves as unchanged each $current\_events\_list_i$ whose corresponding $next\_events\_list_i$ is not a member of the next_earliest_events subset.

The set of n current_events_lists now contain bin events which are cross correlated with each other. Every combination that can be generated, by selecting one bin event from each of the current_events_lists, is produced. Step 1406. Note that any selection from each of the current_events_lists produces a valid combination, provided that every combination has at least one state declaration bin event selected. Each such combination is written into the combinations_hash_table as discussed above. Note also that if at least any one of the current_events_lists still contains the initial event of value of UNKNOWN, then all combinations with this special UNKNOWN event are considered valid cross-correlations and are written to the combinations_hash_table.

Having found all the cross-correlations of which the bin events of next_earliest_events may be a part, every $next\_events\_list_i$ which is a member of next_earliest_events is reset to be empty. Step 1407.

If every file_$pointer_i$ points to the end of its file i, rather than to a bin event, then all cross-correlations have been found. Step 1408. Otherwise, for each file_$pointer_i$ corresponding to a member of the next_earliest_events subset and not pointing to the end of file, read the bin event pointed to by its file_$pointer_i$, and all successive bin events in the file, until reaching either: i) the first bin event whose time stamp is greater (greater, that is, than the time stamp of the first bin event read when the read began), or ii) the end of file. Step 1409. All of the bin events read, for each bin event file i, except the last bin event which is at the greater time stamp, are placed in $next\_events\_list_i$. Step 1410.

Go back to the step where next_earliest_events subset is identified from among the n next_event_lists. Step 1411.

3.4.1 Coverage Cross Function

The "coverage" function, with the CROSS command (which we refer to as the "coverage cross" function), is shown in FIG. 12 and is described in the Microfiche Appendix at Section 11.5. This function is similar to query_x in the sense that it also takes a list of two or more handles to coverage instances and determines cross correlation information from them. The coverage instance handles are specified to the coverage cross function by the parameter <coverage cross handles to coverage instances>. The output of coverage cross, unlike query_x, is a report to a file specified by the <coverage cross output file>. The coverage cross function operates in a similar manner to query_x and produces similar cross correlation information. The coverage cross function processes the bin event files of the coverage instances passed to it and produces a report listing each combination detected and the number of times each such combination occurred. As with query_x, coverage cross also determines the maximum number of possible combinations and the percentage of actual combinations which have occurred relative to this maximum number.

4. Hardware Environment

Typically, the verification architecture of the present invention is executed within the computing environment (or data processing system) such as that of FIG. 11. FIG. 11 depicts a workstation computer 1100 comprising a Central Processing Unit (CPU) 1101 (or other appropriate processor or processors) and a memory 1102. Memory 1102 has a portion of its memory in which is stored the software tools and data of the present invention. While memory 1103 is depicted as a single region, those of ordinary skill in the art will appreciate that, in fact, such software may be distributed over several memory regions or several computers. Furthermore, depending upon the computer's memory organization (such as virtual memory), memory 1102 may comprise several types of memory (including cache, random access memory, hard disk and networked file server). Computer 1100 is typically equipped with a display monitor 1105, a mouse pointing device 1104 and a keyboard 1106 to provide interactivity between the software of the present invention and the chip designer. Computer 1100 also includes a way of reading computer readable instructions from a computer readable medium 1107, via a medium reader 1108, into the memory 1102. Computer 1100 also includes a way of reading computer readable instructions via the Internet (or other network) through network interface 1109.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims and equivalents.

What is claimed is:

1. A method for monitoring a device under test, comprising the steps performed by a data processing system of:
   forking off a first coverage instance process for monitoring a device under test;
   applying a stimulus to a first input of the device under test; and
   monitoring, with the first coverage instance process, a first output of the device under test.

2. A method for monitoring a device under test, comprising the steps performed by a data processing system of:
   forking off a first coverage instance process for monitoring a device under test;
   applying a stimulus to a first input of the device under test;
   monitoring, with the first coverage instance process, a first output of the device under test; and
   querying a first collection of data of the first coverage instance process.

3. The method of claim 2, further comprising the step of: applying a second stimulus to the device under test in response to a result of the querying
   of the first collection of data.

\* \* \* \* \*